US009470755B1

(12) United States Patent
Foutz et al.

(10) Patent No.: US 9,470,755 B1
(45) Date of Patent: Oct. 18, 2016

(54) METHOD FOR DIVIDING TESTABLE LOGIC INTO A TWO-DIMENSIONAL GRID FOR PHYSICALLY EFFICIENT SCAN

(71) Applicant: Cadence Design Systems, Inc., San Jose, CA (US)

(72) Inventors: Brian Edward Foutz, Charlottesville, VA (US); Steev Wilcox, San Jose, CA (US); Vivek Chickermane, Slaterville Springs, NY (US); Krishna Vijaya Chakravadhanula, Vestal, NY (US); Paul Alexander Cunningham, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/738,746

(22) Filed: Jun. 12, 2015

(51) Int. Cl.
*G06F 11/22* (2006.01)
*G06F 17/50* (2006.01)
*G01R 31/3177* (2006.01)

(52) U.S. Cl.
CPC .................. *G01R 31/3177* (2013.01)

(58) Field of Classification Search
CPC .................. G01R 31/3177; G01R 31/318583; G01R 31/318513; G01R 31/318536; G01R 31/318547; G06F 17/505; G06F 2217/14; G06F 17/50; G06F 2217/62
See application file for complete search history.

(56) References Cited

U.S. PATENT DOCUMENTS

| 2012/0210290 | A1* | 8/2012 | Liu | G06F 17/50 716/132 |
| 2012/0233513 | A1* | 9/2012 | Chang | G01R 31/31858 714/731 |
| 2012/0240092 | A1* | 9/2012 | Ge | G06F 17/505 716/119 |
| 2014/0310565 | A1* | 10/2014 | Bhagat | G01R 31/31854 714/727 |
| 2015/0074478 | A1* | 3/2015 | Xiang | G01R 31/31851 714/727 |

* cited by examiner

*Primary Examiner* — Nha Nguyen
(74) *Attorney, Agent, or Firm* — Kenyon & Kenyon LLP

(57) ABSTRACT

Methods and computer-readable media for effecting physically efficient scans of integrated circuit designs may include selecting a two-dimensional grid size for exposure to the method, the two-dimensional grid having a size that includes a first side length, a second side length, and a number of flops. The method is performed to select a two-dimensional grid size that maximizes compression efficiency and limit wiring congestion on the IC. In one aspect, the method may be performed on each region of the grid that maintains one of a respective first side length and a respective second side length greater than one, including selecting a larger side, determining if the larger side is odd or even, and dividing the grid along the larger side into two regions each having a proportion of the flops. The scans of the resulting regions are efficient, and consequently facilitate integrated circuit design and subsequent manufacture.

20 Claims, 12 Drawing Sheets

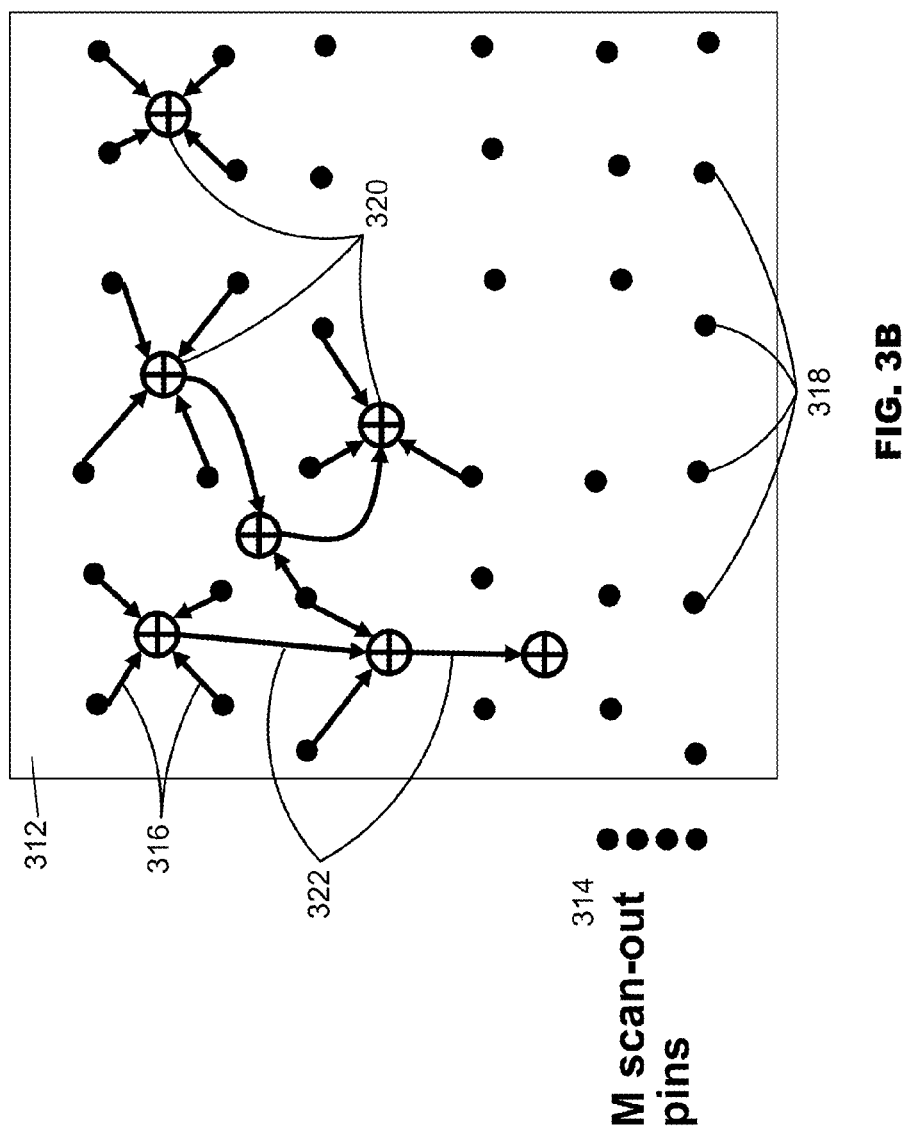

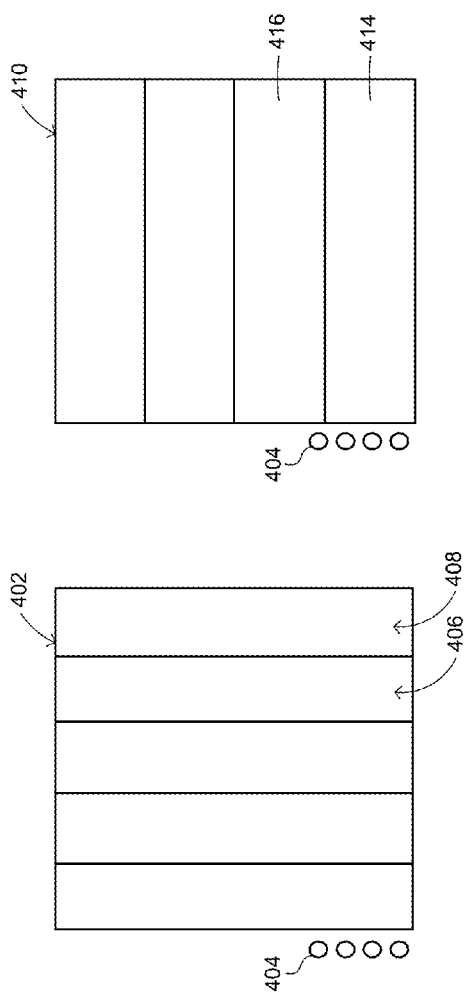
FIG. 4A
FIG. 4B
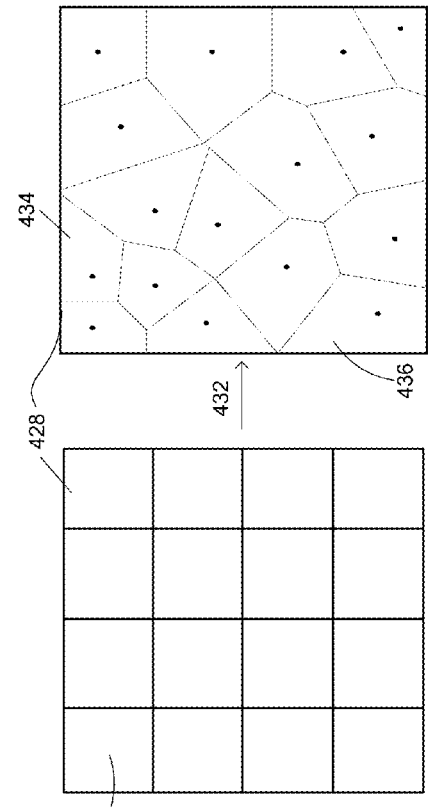
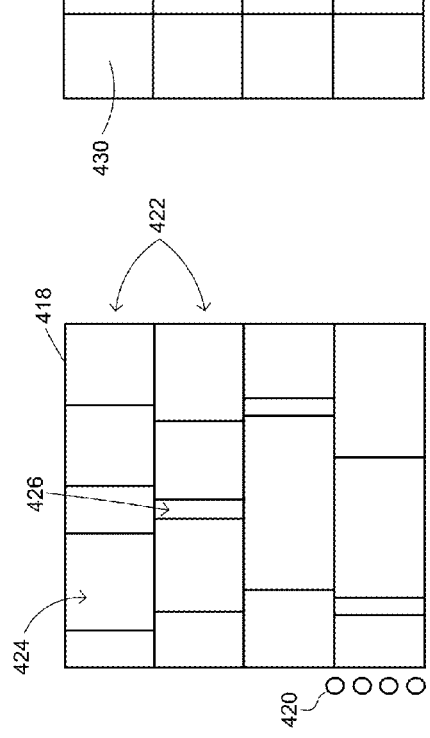
FIG. 4C
FIG. 4D

METHOD FOR DIVIDING TESTABLE LOGIC INTO A TWO-DIMENSIONAL GRID FOR PHYSICALLY EFFICIENT SCAN

CROSS-REFERENCE TO RELATED APPLICATIONS

This application is being filed concurrently with U.S. patent application Ser. No. 14/738,763, entitled "Method for Using XOR Trees for Physically Efficient Scan Compression and Decompression Logic," and with U.S. patent application Ser. No. 14/738,765, entitled "Method for Using Sequential Decompression Logic for VLSI Test in a Physically Efficient Construction," both of which are incorporated herein by reference in their entireties.

TECHNICAL FIELD

The present invention relates to methods and computer-readable media for testing integrated circuit designs; the invention also relates to an integrated circuit implementing a physically efficient scan by dividing testable logic into a 2-dimensional grid.

BACKGROUND

Modern integrated circuits ("ICs") in production require an enormous volume of components. Testing of those ICs requires a large number of test patterns. Transition fault testing has become more prominent, requiring many times more patterns than before. As the chip size and the ratio of logic to be tested per input/output test pin increases dramatically, the amount of data necessary to be supplied by techniques such as automatic test pattern generation ("ATPG") has become voluminous. Design for test ("DFT") designers are faced with the challenge of inputting, for each of these large chips, a huge volume of scan test sequences via a minimal number of test pins. Therefore, with ATPG only, the required test time increased and the required amount of tester memory increased, both of which increased cost associated with DFT.

In order to address these challenges, DFT designers have used a technique called Test Compression. Test Compression reduces test data volume and test application time ("TAT") while retaining test coverage. Using Test Compression, highly compressed test data can be loaded onto the scan chains from low-pin count automated test equipment ("ATE"), using an on-board DeCompressor which decompresses the compressed test data before loading them to a large number of scan chains. After applying the scan chain data to the IC, the response data is then compressed for measurement and comparison. Test Compression recognizes that only a small percentage of scan cells in a scan chain ("care bits") generated by ATPG are necessary for testing. Test Compression modifies the design to apply the care bits in shorter scan chains, reducing the TAT. The compression ratio generated by Test Compression methods is capable of greatly reducing the test data volume and TAT. For example original data having a volume of 6 Gb and TAT of 20 seconds is, at a 100× compression ratio, reduced by 99% to 60 Mb and TAT of 0.2 seconds.

Test Compression is driven by two structures: a Decompressor and a Compressor (or Compactor). The Decompressor drives the compressed test stimuli onto the IC from the small number of scan-in pins on the ATE to the large number of internal scan channels which feed the logic under test. The Decompressor is designed to allow a continuous flow of stimuli so that it is possible to load the scan chain data for a given test onto the IC and to unload from the IC the previous test response data to the Compressor, all in a single clock cycle. Compression and De-compression logic generally are built using discrete logic gates such as XORs, multiplexers and flip-flops and placed inside a logic module called CoDec which is normally placed in one corner of the IC. Wires transfer test stimuli from the DeCompressor inside the CoDec to the head of the scan channels which may be distributed across the area of the IC. Similarly wires from the tails of the scan channels transfer the test stimuli to the Compressor inside the CoDec.

Wiring all of these connections directly between the scan chains scattered over the surface area of the IC and the decompression and compression logic is referred to as traditional global scan wiring. To reduce the cost of testing ICs DFT engineers try to build more scan chains of shorter length to increase the compression ratio. Higher compression ratios mean that there are more wires running from the CoDec to the heads and tails of the shorter and more numerous scan chains, The additional wiring increases the footprint of the IC and may lead to wiring congestion in the area directly around the decompression logic and compression logic, and the use of extremely long wires to form some of the connections. For compression ratios exceeding 100×, congestion is extreme since there is an extremely large number of wires terminating and originating from a small area of compression logic. As the compression ratios increase, due to better compression algorithms, traditional global placement of logic is no longer appropriate. Other methods have been introduced in efforts to correct the on-board congestion issues associated with compression logic, such as XOR mapping and partitioned Compressor-Decompressors. However, XOR mapping and partitioned Compressor-Decompressor methods are at best incremental improvements.

As chip complexity increases, compression ratios have to increase. However, physical chip layout can prevent implementation of large compression ratios. At a certain point, physical design can become a bottleneck, limiting the total number of wires that can be manufactured in contact with on-board location of the decompression logic and compression logic.

BRIEF DESCRIPTION OF THE DRAWINGS

FIG. 3B illustrates distribution of the compression logic over the 2-dimensional IC by placement of XOR gates involved in the compression logic over the chip area.

FIG. 4A illustrates a 1-dimensional column distribution scheme for a CoDec.

FIG. 4B illustrates a 1-dimensional row distribution scheme for a CoDec.

FIG. 4C illustrates a 2-dimensional distribution scheme for a CoDec.

FIG. 4D illustrates a 2-dimensional logic intensive distribution scheme for a CoDec.

DESCRIPTION OF EMBODIMENTS

Figure 1:
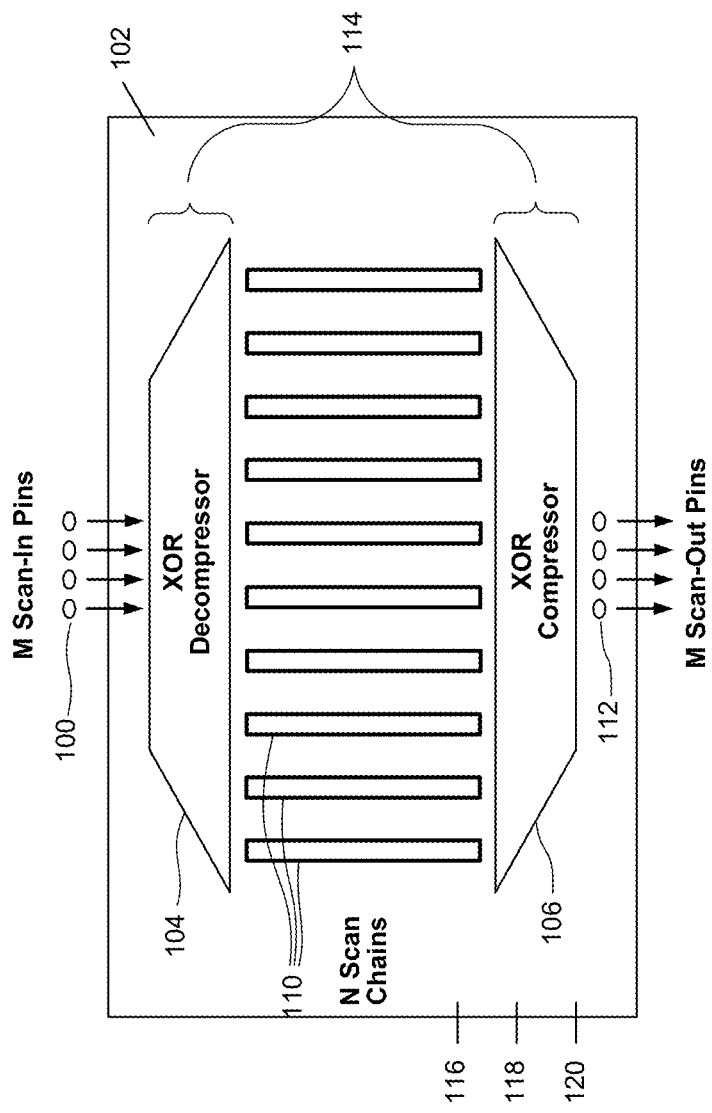
FIG. 1 illustrates application of test stimuli from an ATE to an IC using a Decompressor, which transfers compressed test data from M scan-in pins into uncompressed test data that can be loaded into N scan chains, and unloading of response data after the application using a Compressor, which compresses response data from N scan chains and unloads to M scan-out pins.

The following description of embodiments provides non-limiting representative examples referencing numerals to particularly describe features and teachings of aspects of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention so that other implementations of aspects of the, not specifically described but within the knowledge of a person of skill in the art having read the description of embodiments, would be understood to be consistent with application of aspects of the invention.

One aspect of the present disclosure is to provide methods for testing integrated circuit design by dividing testable logic into a 2-dimensional grid so as to implement a physically efficient scan. The methods herein address at least one of the test decompression and test compression problems described above, and thus provide a solution for determining a physically efficient manner of dividing a surface area of an IC into a grid such that application and scanning of test data can be completed most efficiently.

In one embodiment, the method for dividing an area of an integrated circuit into a 2-dimensional grid comprises: determining a grid size of the 2-dimensional grid and a number of flops over which the 2-dimensional grid is situated, the grid size having a first side length and a second side length; for each region of the grid having one of a respective first side length and a respective second side length that is greater than one: i) selecting a larger side, having a length X, from the respective first side length and the respective side length, ii) determining if the length X is even or odd, iii) responsive to the length of the larger side being odd, dividing the grid region into: a first region having:

$$\frac{\text{floor}\left(\frac{X}{2}\right)}{X} \times a \text{ number of flops for the grid region, flops,}$$

and
a second region having:

$$\frac{\text{floor}\left(\frac{X}{2}\right)+1}{X} \times a \text{ number of flops for the grid region, flops,}$$

iv) responsive to the length of the larger side being even, dividing the grid region into: a first region and a second region each having:

x/2×a number of offlops for the grid region.

The method further comprises repeating i)-iv) until said respective first side length is one and said respective second side length is one, and performing the physical test scan after the repetitions are complete.

In some embodiments the number of flops over which the 2-dimensional grid is situated is determined from a layout of flops provided in the form of a circuit schematic, such as a netlist. The flop layout data is available once the plan for the logic to be placed on the die is available or once the logic is actually placed on the die.

In some embodiments, the method further assigns new lengths to each of the first region and the second region for the cases in which the larger side is of an odd length. According to aspects of the method, the first region is assigned a new length equal to floor, $$\left(\frac{X}{2}\right),$$

and the
second region is assigned a new length equal to floor $$\left(\frac{X}{2}\right)+1.$$

The other length that is not subject to the division remains the same as the length of the initially bisected grid.

In some embodiments, the method further assigns new lengths to each of the first region and the second region for the cases in which the larger side is of an even length. According to the method, the first region is assigned a new length equal to x/2. Similarly, the second region is assigned to a new length equal to x/2.

In yet other embodiments, the resulting grid regions from the method are of a size that is 1 by 1. Accordingly, in the 1 by 1 resulting regions of the grid, only one scan chain is included. Alternatively, in the 1 by 1 resulting regions of the grid, multiple scan chains are included. In those embodiments, in which multiple scan chains reside in the 1 by 1 regions, local broadcasts are implemented from the decompression logic such that each of the multiple scan chains receives the decompressed test data.

In yet another aspect, a non-transitory computer-readable medium for dividing a 2-dimensional grid to place testable logic in a design for test integrated circuit is provided, implementing the foregoing method.

In one embodiment, a method for dividing an area of an integrated circuit into a 2-dimensional grid is described, involving: determining a grid size of the 2-dimensional grid and a number of flops over which the 2-dimensional grid is situated, the grid size having a first side length and a second side length; for each region of the grid having one of a respective first side length, N, and a respective second side length, M, that is greater than one: i) determining if the respective first side length is larger than the respective second side length, ii) responsive to the first side length being larger than the second side length: determining if the first side length is even, responsive to the first side length being even: dividing the grid region along the first side length to create a first region and a second region each having half of the flops of the grid region, and responsive to the first side length not being even: dividing the grid region along the first side length to create a first region having a portion of the flops of the grid region and a second region having a remainder of the flops of the grid region; iii) responsive to the first side length being smaller than the second side length: determining if the second side length is even; responsive to the second side length being even: dividing the grid region along the second side length to create a first region and a second region each having half of the flops of the grid region; and responsive to the second side length not being even: dividing the grid region along the second side length to create a first region having a portion of the flops of the grid region and a second region having a remainder of the flops of the grid region. The method further comprises repeating i)-iii) until said respective first side length is one and said respective second side length is one, and performing the physical test scan after the repetitions are complete.

In some embodiments, the method further assigns new lengths to each of the first region and the second region for the cases in which the larger side is of an odd length. According to the method, if N exceeds M and N is odd, then the first region is assigned a new length equal to floor $$\left(\frac{N}{2}\right),$$

and the second region is assigned a new length equal to floor $$\left(\frac{N}{2}\right)+1.$$

Similarly, if M exceeds N and M is odd, then the first region is assigned a new length equal to floor $$\left(\frac{M}{2}\right),$$

and the second region is assigned a new length equal to floor $$\left(\frac{M}{2}\right)+1.$$

The other length that is not subject to the division remains the same as the length of the initially bisected grid.

In some embodiments, the method further assigns new lengths to each of the first region and the second region for the cases in which the larger side is of an even length. According to the method, if N exceeds M and N is even, then both of the first region and the second region are assigned new lengths of N/2. If M exceeds N and M is even, then both of the first regions and the second region are assigned new lengths of N/2.

In yet other embodiments, the resulting grid regions from the method are 1 by 1. In the 1 by 1 regions, only one scan chain is included. Alternatively, in the 1 by 1 regions, multiple scan chains may be included. In those embodiments, in which multiple scan chains reside in the 1 by 1 regions, local broadcasts are implemented from the decompression logic such that each of the multiple scan chains receives the decompressed test data.

To implement a test as part of a DFT, a test pattern, including test stimuli, must be applied to the IC. When compression and decompression logic is implemented, the Decompressor is located between test input pins and scan chain heads and the Compressor is located between the scan chain tails and the test output pins. A scan clock is pulsed to shift the test patterns into the scan chains, and after the test patterns are stimulated the test response are shifted out to the chip output pins. The test results from the DUT are then available for comparison against the expected results. The Decompressor is implemented on board the IC in order to expand the test data from a small number of input pins on the ATE to a larger number of scan chains on the IC. The Compressor is implemented on board the IC in order to compress the results data from a large number of scan chains on the IC to a smaller number of output pins on the ATE.

FIG. 1 illustrates application of test stimuli from an ATE to an IC using a Decompressor, which converts M scan-in pins into N scan chains, and removal of response data after the application using a Compressor, which converts N scan chains into M scan-out pins. M scan-in pins 100 from the ATE are aligned with test patterns having test stimuli. When the mode 116 of the IC 102 is switched to "test mode", the test patterns are shifted onto the IC for a number of cycles associated with scan clock 118. The test patterns propagate through the XOR Decompressor 104 and populate register sets associated with the N scan chains 110. The test data is then stimulated, or tested, for a number of capture cycles associated with the functional clock 120. Then the test results are shifted out of the IC, for a number of cycles associated with scan clock 118. The test results propagate through the XOR Compressor 106 and out of the IC onto M scan-out pins 112. The test results are then held in the memory of ATE for comparison to the expected data. The Decompressor 104 connected between the scan in pins 108 and the scan chains 110 is an M to N directed acyclic graph (DAG). The Compressor 106 located between the scan chains 110 and the scan out points 112 is an N to M DAG. Collectively, the Compressor 104 and the Decompressor 106 comprise a CoDec 114.

Figure 2:
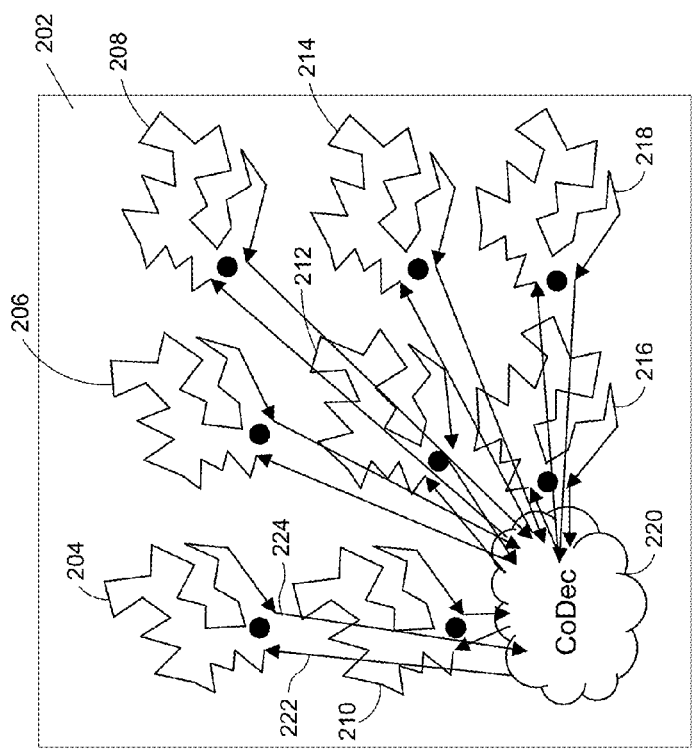
FIG. 2 illustrates an IC hosting DFT compression and decompression logic according to a global placement topology.

FIG. 2 illustrates an IC hosting DFT compression and decompression logic according to a global placement topology. IC 202 includes 8 different scan chains (204, 206, 208, 210, 212, 214, 216, 218) and CoDec 220. CoDec 220 includes the compression and decompression logic for the entire IC 202. Accordingly, before test data is loaded into each of the scan chains, it must pass through the CoDec 220. After the test data has been decompressed in the CoDec 220, it is routed to a corresponding portion of the IC and a respective scan chain. To perform this routing, wires (e.g., 222) connect from the Decompressor portion of CoDec 220 to the scan chains. After the test data has been stimulated, the test results return to the CoDec 220 for compression via wires (e.g., 224).

The area immediately surrounding the CoDec 220 becomes congested as the number of wires from the scan chains increases. The shorter the scan chains, the more total wire length needed to connect to and from the CoDec 220. Overall, the total chain length is independent of the number of scan chains. As the compression ratio implemented by the CoDec increases, the length of each scan chain (e.g., 204) decreases. However, as each scan chain is shortened, the total number of scan chains increases, and the wire length to and from the scan chains to the CoDec increases. In these circumstances, the result is that at least some of the test data travels over long wires in order to be compressed and decompressed. Therefore, as compression ratios improve, complex wiring from the scan chains to the CoDec result.

Figure 3A:
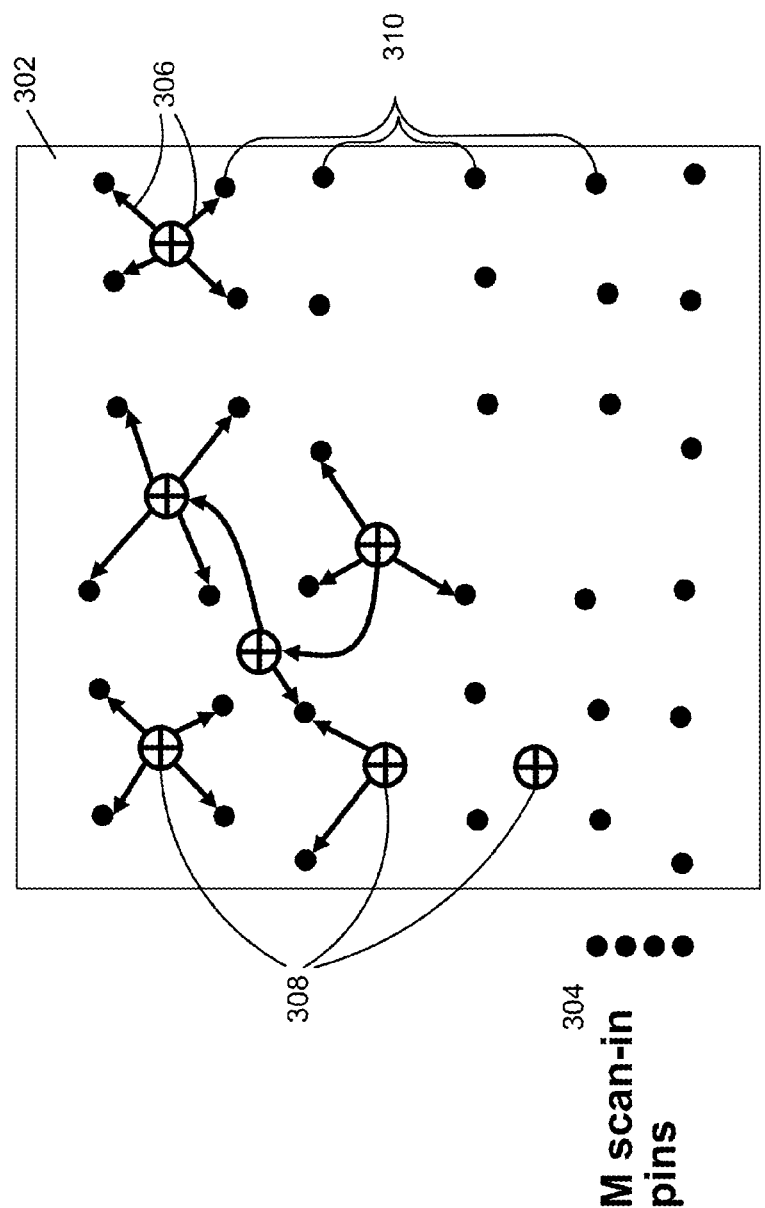
FIG. 3A illustrates distribution of the decompression logic over the 2-dimensional IC by placement of XOR gates involved in the decompression logic over the chip area.

FIG. 3A illustrates distribution of the decompression logic over the 2-dimensional IC by placement of XOR gates involved in the decompression logic over the chip area. One aspect of the present invention enables provision of less complex wiring while implementing a high decompression ratio. Accordingly, an aspect of an embodiment includes a physically distributed Decompressor, which reduces wire length and minimizes congestion, can be most efficiently placed. FIG. 3 illustrates an IC 302 that has M scan-in pins 304, which provide the IC 302 with the test stimuli via test patterns. The IC 302 includes N scan channel nodes 310 that are available for application of the test stimuli 306. In order to feed all of the N scan channel nodes 310, discrete XOR gates 308 are distributed throughout the surface of the IC 302 for ease of forming wire connections between the N scan channel nodes 310 and the discrete XOR gates 308. On the surface of the IC 302, only some of the N scan channel nodes 310 are labeled, but it should be understood that the labeling is limited for clarity, and that 310 refers to all of the presented N scan channel nodes on the surface of IC 302.

FIG. 3B illustrates distribution of the compression logic over the 2-dimensional IC by placement of XOR gates involved in the compression logic over the chip area. Aspects of the present invention provide a solution for providing less complex wiring while implementing a high compression ratio. In an embodiment, a physically distributed Compressor, which reduces wire length and minimizes congestion, can be placed efficiently. FIG. 3B illustrates an IC 312 that has M scan-in pins 314, which provide the IC 312 with the test stimuli via test patterns. The IC 312 includes N scan channel nodes 318 that are available for removal of the test response data. In order to recover test response data associated with all of the N scan channel nodes 318, discrete XOR gates 320 are distributed throughout the surface of the IC 312 for ease of forming wire connections between the N scan channel nodes 318 and the discrete XOR gates 320. Removal of the test response data is then performed by cascading the test response data over a series of XORs as shown in 322. On the surface of the IC 312, only some of the N scan channel nodes 318 are labeled, but it should be understood that the labeling is limited for clarity, and that 318 refers to all of the presented N scan channel nodes on the surface of IC 312.

When placing XOR gates for compression and decompression, it should be understood that different schemes can be used to partition an IC for distribution of test stimuli and test patterns and in order to cull test response data. Partitioning the IC can be performed according to 1-dimensional or 2-dimensional structures. The method, device, and system described herein are specifically provided with regard to a 2-dimensional distribution structure. FIGS. 4A to 4D illustrate embodiments of some of these different schemes. It is to be understood that FIGS. 4A to 4D are non-limiting examples of XOR distribution schemas, which could further be applied to other combinational gate distribution schemas.

FIG. 4A illustrates a 1-dimensional column distribution scheme for a CoDec. In FIG. 4A, the IC 402 is divided into vertical strips, or columns. Scan in and scan out data is provided via M scan pins 404. Inside each of the columns, logic for compression and decompression is placed, in some embodiments in the form of a CoDec. Each vertical strip, including strips such as 406 and 408, is placed such that all of the strips each contain the same number of flops. Grid strips 406 and 408 each indicate an area inside of which compression logic and decompression logic is placed for distribution to localized flops. The grid cells shown do not indicate actual physical division of the IC into separate pieces, but instead indicate a hypothetical dividing line over which wiring for scan chain connections to CoDecs cannot cross. The vertical strip distribution schema is particularly well-suited to be implemented with fullscan technology, where the scan input and output is distributed around the boundary of the chip. Compression logic and decompression logic is generated locally within in each of the strips. Division of an IC into vertical strips, however, does not improve matters when there is a high compression ratio: the result is too many strips.

FIG. 4B illustrates a 1-dimensional row distribution scheme for a CoDec. In FIG. 4B, the IC 410 is divided into horizontal strips, or rows. Scan in and scan out data is provided via M scan pins 412. Inside each of the rows, logic for compression and decompression is placed, in some embodiments in the form of a CoDec. Each horizontal strip, including strips such as 416 and 414, is placed such that all of the strips each contain the same number of flops. Grid strips 416 and 414 each indicate an area inside of which compression logic and decompression logic is placed for distribution to localized flops. The grid cells shown do not indicate actual physical division of the IC into separate pieces, but instead indicate a hypothetical dividing line over which wiring for scan chain connections to CoDecs cannot cross. Like the vertical strip distribution, the horizontal strip distribution schema is particularly well-suited to be implemented with fullscan technology, where the scan input and output is distributed around the boundary of the chip. Compression logic and decompression logic are generated locally within each of the strips. Division of an IC into horizontal strips, however, does not improve matters when there is a high compression ratio: the result is too many strips.

FIG. 4C illustrates a 2-dimensional distribution scheme for a CoDec. In FIG. 4C, one of the strip schemes of FIGS. 4A and 4B is first implemented. Following implementation of, for example, the division of the IC 418 into horizontal strips such as horizontal strips 422, the horizontal strips are then divided into grid cells strictly along the opposite axis, the vertical axis. This is done by dividing the horizontal strips vertically, to create a number of cells each containing the same number of flops. For example, FIG. 4C includes grid cells 424 and 426. As shown, grid cell 426 is narrower than grid cell 424. Therefore, it should be understood that the grid cell 426 includes a region having a higher flop density than the flop density in grid cell 424. Grid cells 424 and 426 each indicate an area inside of which compression logic and decompression logic is placed for distribution to localized flops. The grid cells shown do not indicate actual physical division of the IC into separate pieces, but instead indicate a hypothetical dividing line over which wiring for scan chain connections to CoDecs cannot cross. Similarly, following implementation of the IC 402 into vertical strips, the vertical strips are then divided into grid cells. This is done by dividing the vertical strips horizontally, to create a number of cells each containing the same number of flops.

In some embodiments, when flops are distributed unevenly about IC 402, the end result is that the grid is extremely uneven and difficult to wire.

FIG. 4D illustrates a 2-dimensional logic intensive distribution scheme for a CoDec. In FIG. 4D, the IC is divided according to a k-means method. In accordance with the method, the chip is divided into cells. As shown in the first part of FIG. 4D, IC 428 is divided into grid cells, including grid cell 430. Initial division of the IC 428 into grid cells is arbitrary. Although in FIG. 4D, the initial division shows the IC 428 divided into grid cells of equal size, this is not necessarily the case. After division of the chip into cells, an iterative process 432 is applied to morph the boxes into different shapes to get the optimal shape for distribution of the CoDec logic. As shown in the second part of FIG. 4D, and after the iterative process 432 is applied to the IC 428, the chips is divided into grid cells of different sizes. For example, after the k-means method is complete, IC 428 includes grid cells 436 and 434. Grid cells 434 and 436 are of different lengths and different widths. Grid cells 434 and 436 each indicate an area inside of which compression logic and decompression logic is placed for distribution to localized flops. The grid cells shown do not indicate actual physical division of the IC into separate pieces but instead indicate a hypothetical dividing line over which wiring for scan chain connections to CoDecs cannot cross. However, implementation of the k-means method requires that a processing device solves an optimization problem based on the convergence of a complex algorithm. Accordingly, the time and processing power used to solve the optimization problem is often greater than the time and processing power available for the determination.

As described with reference to FIGS. 4A to 4D, dividing an IC does not mean physically dividing the IC into different pieces. Instead, division of the IC refers to the formation of the boundary of imaginary cells over a surface of the IC. When an IC is divided into horizontal strips, for example, imaginary dividing lines that delimit the boundaries of the cells are formed along the horizontal lines. The resulting horizontal strips between the dividing lines each include a number of flops, and all of the flops within a horizontal strip are serviced by the same compression and decompression logic. Therefore, all of the decompression and compression logic wiring leading to and from any flop on the chip is performed within the boundaries of the imaginary cell created by the division procedure.

Therefore, there is a need for construction of an imaginary grid, on the IC, where the logic from the CoDec can be distributed to points on a grid evenly. Distributing the CoDec to points on a grid evenly is to be understood as meaning that, in each location on the IC, the output/input of the CoDec is provided to and unloaded from the same number of flops for testing scan chains. The problem is complex because the grid cells cannot simply be distributed according to an even distribution of grid cells that could be determined with the use of a ruler or another basic dividing apparatus. This is because some parts of the chips have large numbers of flops and other parts of the chip have small numbers of flops, creating high flop density areas and low flop density areas. Each grid cell constructed must have the same number of flops within its bounds. Within each grid cell, a scan chain is formed by connections between the flops. When each grid cell contains scan chains of the same length, then all of the scan in data distributed to the scan chains in the grid cells via the decompression logic can be of the same length. If the scan chains vary in sizes across the grid cells, then the process of loading scan in data results in an additional number of scan shift clock cycles. If the chains are uneven, the additional number of scan shift clock cycles is being performed for at least some null sets of data for the shorter chains. If all of the scan chains are the same length, then the TAT is optimized and distribution of the volume of test data is optimized.

Figure 5:
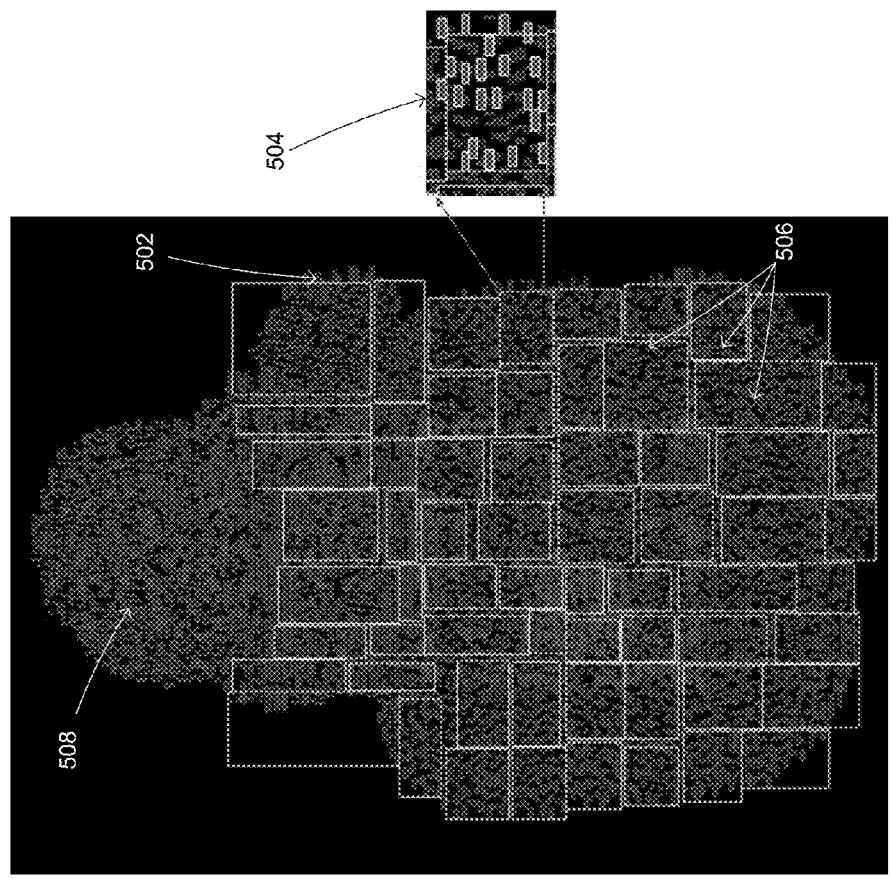
FIG. 5 illustrates an implementation of the bisecting distribution scheme for a CoDec.

FIG. 5 illustrates an implementation of the bisecting distribution scheme for a CoDec on an IC of a product. In FIG. 5, the product has an IC 502, which is covered in various regions by flops, for example flops 504. In some embodiments, not all of the regions of the IC 504 are covered with flops. For example, as shown in FIG. 5, the topmost region 508 of the product does not have any flops. Instead, this region is used to implement an Arithmetic Logic Unit ("ALU") and is entirely devoid of flops. Consequently, the topmost region 508 is not subjected to the bisecting distribution scheme. In the lower region, IC 502 is shown to have a plurality of grid cells 506. In an embodiment, the plurality of grid cells 506 are each of a different shape. However, in some embodiments, at least some of the plurality of grid cells 506 have the same shape. Each of the grid cells 506 depict an area that is serviced by a single logical implementation of a CoDec. A piece of combinational logic is centered in each of the grid cells 506 in order to apply the decompressed data from M scan in data elements to the flops within the respective grid cells. In an embodiment, there are N boxes in the plurality of grid cells 506. M scan ins are decompressed, according to an embodiment, to N scan chains. As each of the grid cells from the plurality of grid cells 506 includes only a single chain, there are N grid cells. Within each of the N grid cells, there are P flops, where P is the number of flops necessary to handle test data of P depth. Therefore, the scan clock must scan in data from the M scan ins for P cycles. After P cycles, the test is stimulated, i.e., the functional clock captures the test response from the combinational part of the logic and captured by the flip-flops. The response data is loaded out of the scan flops and cycled out for P cycles by the scan clock. The data is then compressed via a piece of combinational logic for application to M scan out pins.

Figure 6:
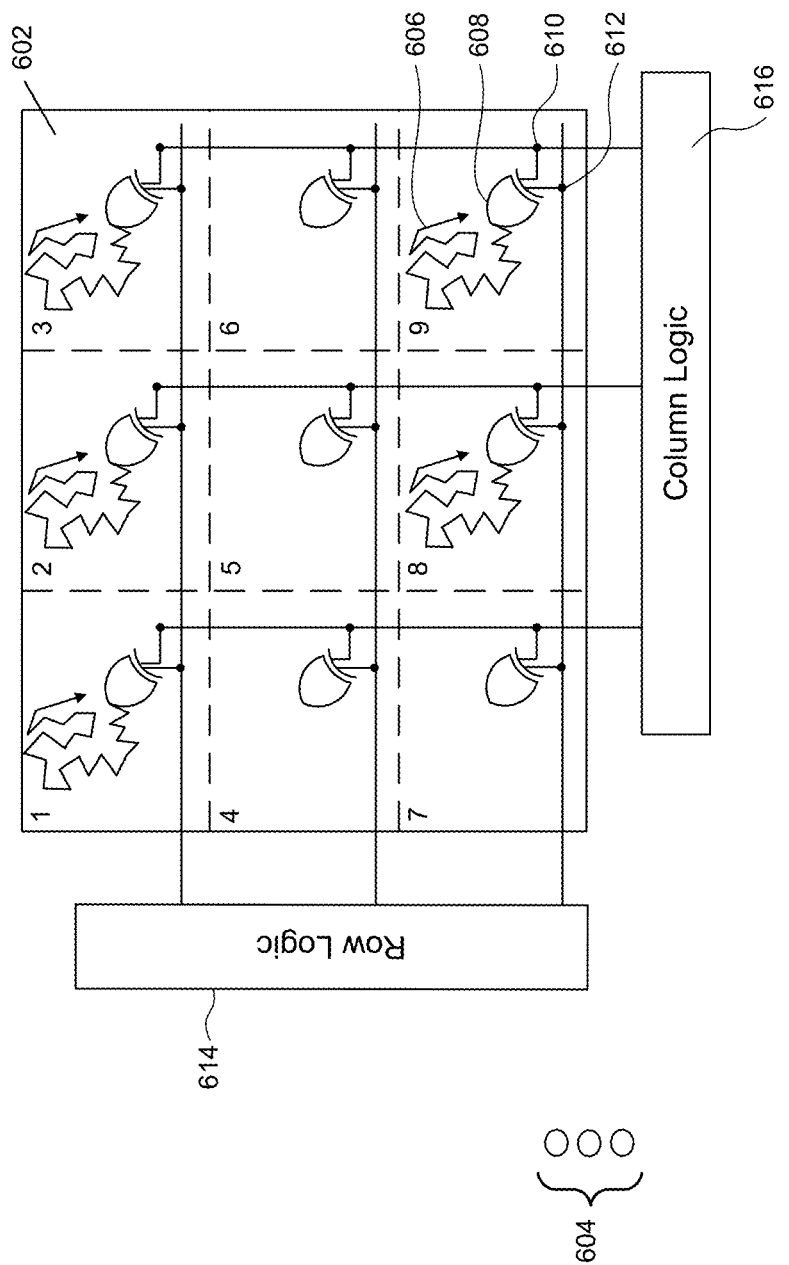
FIG. 6 illustrates an embodiment of an IC having a distributed Decompressor as part of its CoDec.

FIG. 6 illustrates an embodiment of an IC having a distributed Decompressor as part of its CoDec. In FIG. 6, IC 602 is partitioned into a number of regions (1, 2, 3, 4, 5, 6, 7, 8, 9). The distributed Decompressor allows for the IC 602 to be partitioned into a grid of Y by X boxes, with some of the decompression logic in each of the boxes. In IC 602 shown in FIG. 6, the grid is 3 boxes wide and 3 boxes long. In order to implement the distributed Decompressor, the final XOR stage is implemented so that there are localized XOR gates in each of the boxes. Each XOR, in each box, provides test stimuli from the M pins in 604 to the scan chains (e.g., 606) located within a respective box on the IC 602. Each XOR has a wire feeding from the horizontal direction (e.g., 612), from a row of decoding logic 614. Each XOR further has a wire feeding from the vertical direction (e.g., 610), from a column of decoding logic 616. The XOR (e.g., 608) then accepts the wire from the horizontal direction 612 and the wire from the vertical direction 610 as inputs into its gate 608. The output of the XOR is provided to its respective scan chain (e.g., 606) in the grid cell. In an embodiment, the grid cell includes more than one scan chain that receives the output of the XOR gate. In so doing, a unique piece of data is provided for each grid cell. In an embodiment, the distribution of the XOR gates and the division of the grid covers the entire IC 602 area. In another embodiment, the distribution of the XOR gates and the division of the grid covers an area less than the entire IC 602 area.

Figure 7:
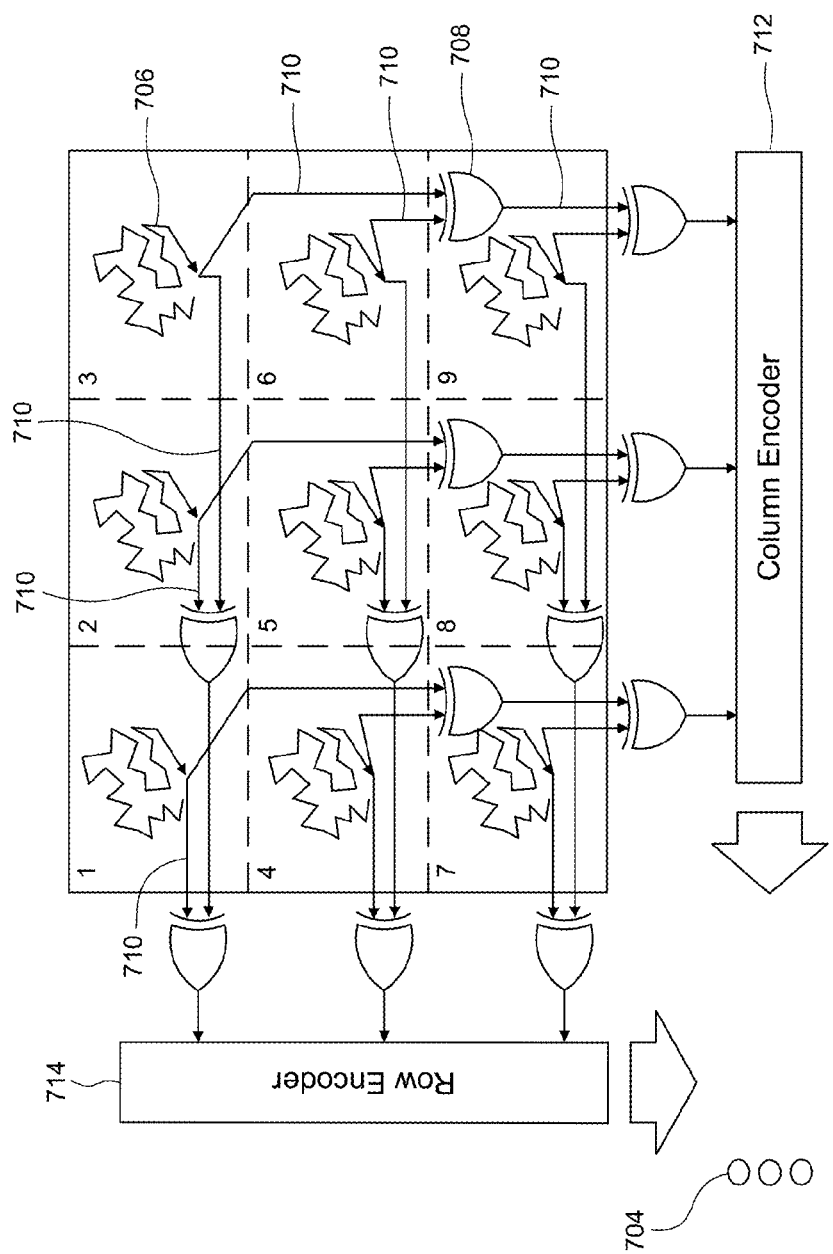
FIG. 7 illustrates an embodiment of an IC having a distributed Compressor as part of its CoDec.

FIG. 7 illustrates an embodiment of an IC having a Compressor as part of its CoDec. In FIG. 7, IC 602 is partitioned into a number of regions (1, 2, 3, 4, 5, 6, 7, 8, 9). The Compressor allows for the IC 702 to be partitioned into a grid of Y by X boxes, with some of the compression logic in each of the boxes. In IC 702 shown in FIG. 7, Y is 3 boxes wide and X is 3 boxes long. In order to implement the Compressor, a first XOR stage is implemented such that the outputs of the scan chains are cascaded. Scan chains are XOR'd with other scan chains. The XOR gates are located on the chip in their respective columns either in between scan chains 710 or proximately located to its associated its scan chain. Starting at one end of the chip, along each column, the scan chains in the column are XOR'd with other scan chains in the same column in a cascading fashion away from the end of the chip. Additional XOR gates are located on the chip in their respective rows, either in between scan chains 710 or proximately located to its associated its scan chain. Starting at the end of the chip next to the end selected for the columns, along each row, the scan chains in the row are XOR'd with other scan chains in the same row in a cascading fashion away from the end of the chip.

As noted in FIG. 7, regions 4, 5, 7, and 8 each contain two XOR gates while regions 1, 2, 6, and 9 each contain a single XOR gate region 3 contains zero XOR gates. Based on the side selected for the top of the column XOR cascades and the side selected for the top of the row XOR cascades, the locations of the number of XOR gates can be rotated 90 degrees, 180 degrees, or 270 degrees. In an embodiment, the corner that rests between the side selected for the top of the column XOR cascades and the top of the row XOR cascades will be the grid cell without the XOR gates. In an embodiment, the grid cells in contact with the sides selected for the top of the column cascades and the top of the row cascades (except for the cornermost grid cell) will be the grid cells with only one XOR gate.

In an embodiment, the Decompressor of FIG. 6 and the Compressor of FIG. 7 can be used together to provide M scan in pins of test stimuli to N scan chains and then decode the test response data returned from the N scan chains to the M scan out pins. In an embodiment, the partitioned regions for the Compressor are the same partitioned regions designated for the distributed Decompressor. In an embodiment, the distributed Decompressor and the Compressor are capable of being used in conjunction as a CoDec.

Figure 8:
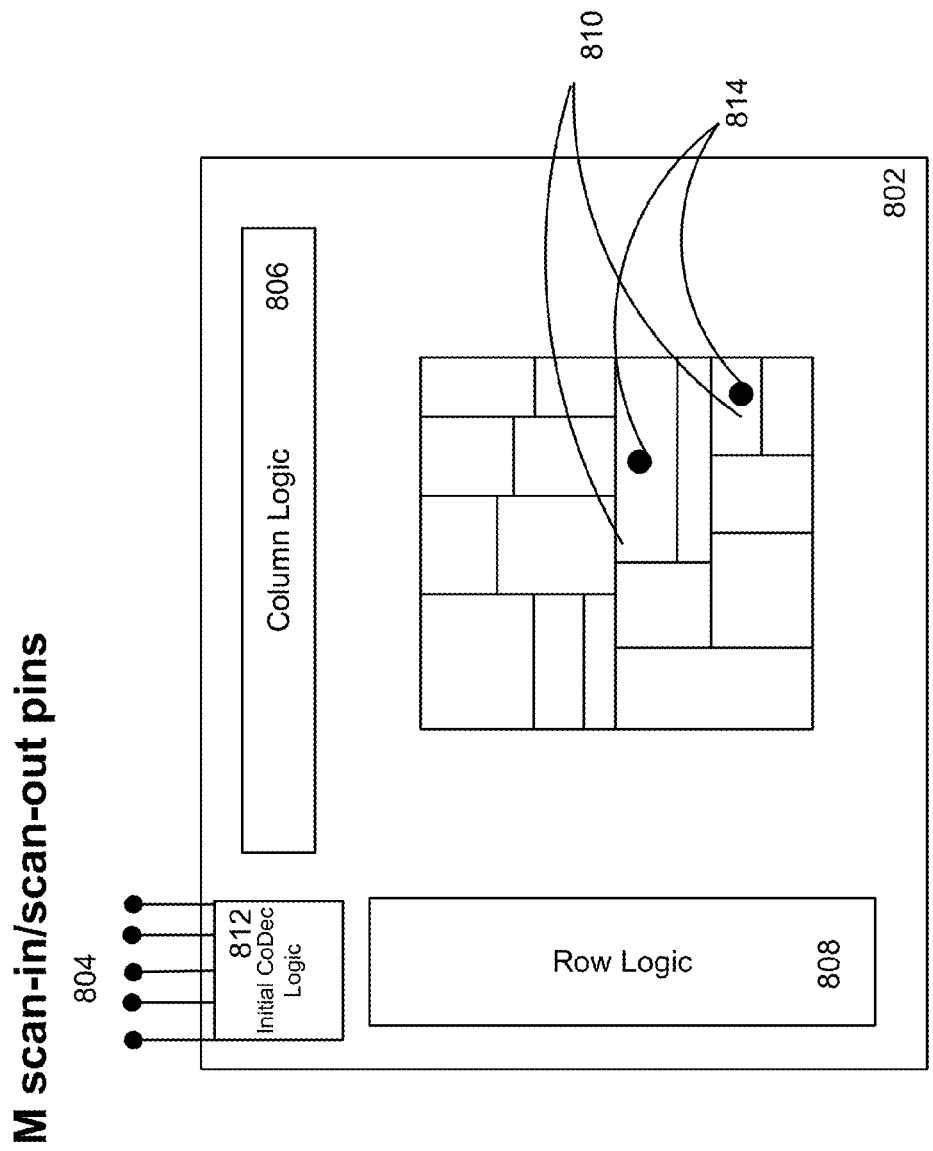
FIG. 8 illustrates an embodiment of an IC dividing the testable logic into the 2-dimensional grid according to the bisecting distribution scheme for a CoDec.

FIG. 8 illustrates an embodiment of an IC dividing the testable logic into the 2-dimensional grid according to the bisecting distribution scheme for a CoDec. FIG. 8 includes an IC 802. As test input, the IC accepts M scan-in/scan-out pins 804. The M scan-in/scan-out pins are used to provide test data to N different scan chains.

The test data available from the scan-in pins is decompressed by initial decompression logic 812. After decompression, all of the terms available from the M scan in pins are available for application to the grid, which was selected to be of the size Y by X. Column logic 806 distributes the terms needed from the initial test data along a first axis. Row logic 808 distributes the terms needed from the initial test data along a second axis. Placement of the wiring extending from the column logic 806 to each of the different points along the Y by X grid, however, is determined in accordance with the bisecting algorithm described further herein. At the point in time when the placement of the grid wiring is determined using the bisecting algorithm, all of the functional logic on the chip has already been implemented, and the flops associated with DFT are implemented on the chip. Only once the bisecting algorithm is completed and the bounds of the grid cells are determined can the wires extending from the column logic 806 be overlaid on to the IC such that there are gates placed in the appropriate locations within the grid cells. Similarly, placement of the wiring extending from the row logic 808 inside of the grid is determined in accordance with the bisecting algorithm. Implementation of the bisecting algorithm can result in code, a schematic, or an image of the bounds of the grid cells within which the compression and decompression logic should be placed. In some embodiments, implementation of the bisecting algorithm results in a determination of the total amount of wire required to connect all of either and/or both of the compression logic across the neighboring grid cells and the decompression logic across the neighboring grid cells.

Only once the bisecting algorithm is completed and the grid cells determined can the wires extending from the row logic be overlaid on to the IC such that there are gates placed in the appropriate locations within the grid cells. In an embodiment, the final combinational gates needed for the CoDec are not placed in the exact center of the grid cells, but are instead placed proximate to the tail of the scan chain in the grid cell. In some embodiments, the final combinational gates needed for the CoDecs are placed in a location within the grid cells according to a designer's choice. Grid cells such as those shown in 810 can be formulated based on application of the bisecting algorithm.

After the test data has been loaded into the tail of the scan chains within each of the grid cells, the response data is cycled out of the scan chains. The response data available from the scan chains is compressed by compression logic. In accordance with an embodiment, the response data is loaded into XOR gates in accordance with the method described above in FIG. 7. As described in detail in FIG. 7, the response data is cascaded along each of the rows and each of the columns into the respective row logic 808 and column logic 806. It is herein understood that the phrases "row logic" and "column logic" are presented at a high level for clarity. However, it should be understood that the row logic and column logic used in the decompression of test data is not the same row logic and column logic used to compress the response data. Additional compression logic 812 is then utilized to finally compress the response data such that it can be output from the M scan out pins 804.

As shown in FIG. 8, contact points 814 are formed between an external structure and scan chains within the grid cells 810. In an embodiment, the contact points are formed at the center of the grid cells. In an embodiment, the contact points are formed proximate to the scan chains within the grid cell. In some embodiments, the final combinational gates needed for the CoDecs are placed in a location within the grid cells according to a designer's choice. These contact points are formed in order to provide the decompressed test data to scan chains within the grid cells, or to retrieve the response data from scan chains within the grid cells for compression. Contact points can be formed electrically and/or physically between the scan chains and the external structure. In an embodiment, the external structure is an actual grid. An actual grid could resemble the grids shown in FIGS. 6 and 7 and provide associated compression or decompression logic. In an embodiment, an actual grid forming contact points 814 is not associated with performance of compression logic or decompression logic and is simply formed from wiring. The contact points are created only once the bisecting algorithm is complete and the grid cells are determined. In an embodiment, the contact points are permanent connections between the external structure and the integrated circuit formed by soldering or hardwiring of circuitry. In an embodiment, the contact points are non-permanent connections between the external structure and the integrated circuit formed by tabs, pins, or electrical inserts.

A test scan is performed over the contact points 814. The test data is loaded onto the flops of the integrated circuit, the test data is stimulated, and the response data is loaded off the flops of the integrated circuit in order to check for manufacturing faults. In an embodiment, the contact points are used for only one of loading test data onto the integrated circuit or retrieving response data from the integrated circuit. In an embodiment, two sets of contact points are provided in a single grid cell, one set for loading test data onto the integrated circuit and one set for loading response data off the integrated circuit.

Figure 9:
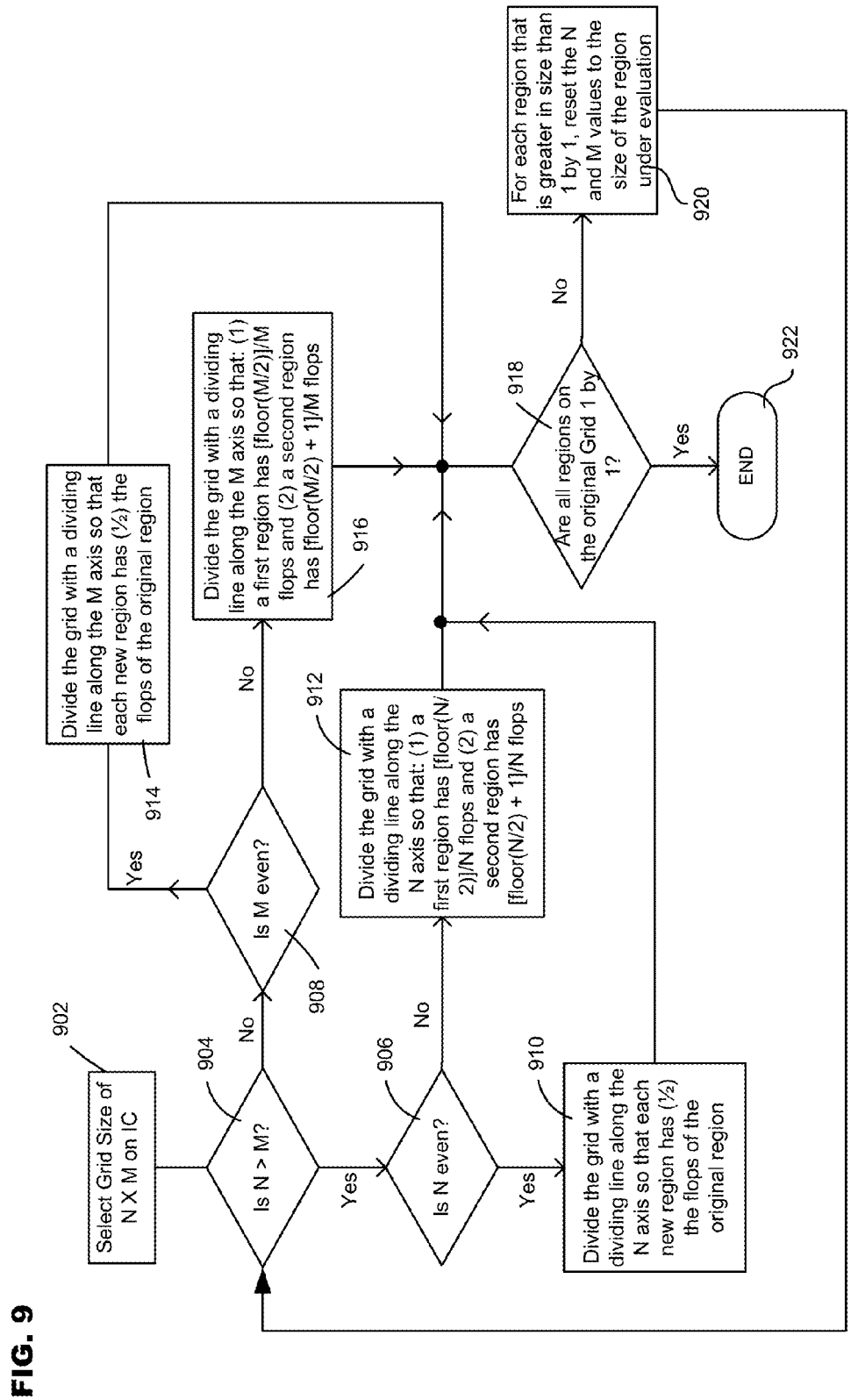
FIG. 9 illustrates a flowchart providing the steps of the bisecting method for dividing the testable logic into the 2-dimensional grid on the IC.

FIG. 9 is a flowchart of the bisecting method for dividing the testable logic into the 2-dimensional grid on the IC. Data regarding the integrated circuit and the flop layout on the integrated circuit can be received or generated to assist with the grid size determination. In some embodiments, a flop layout is provided in the form of a circuit schematic, such as a netlist. In other embodiments, the flop layout is provided in an image of the integrated circuit and the relative placement of the flops over the surface of the integrated circuit. The data regarding the design of the integrated circuit and flop layout can be received in code format, a schematic format, or an imaged format, among other similar means for providing data regarding a concrete chip layout.

First, at 902, the grid size of the IC is determined. The grid size can be determined in several different ways. In some embodiments, the designer can provide to the computer, or a processing device, via an input the desired dimensions of the grid (e.g., 20×20, 200×200, or 20×80). The input from the user is collected from a field in a graphical user interface ("GUI") or through other generally available user input methods. In some embodiments, the grid size is determined automatically from a number of factors. The number of factors can include any combination of, but is not limited to, the following: the number of scan inputs, the dimensions of the integrated circuit (or the die), or the number of flops desired in each grid cell. The number of scan inputs, the dimensions of the integrated circuit, and the number of desired flops can be inferred from available data (e.g., the dimensions of the integrated circuit from the received data including a layout of flops on the integrated circuit that also includes the layout of the integrated circuit) or requested directly from the designer (e.g., a prompt or a field available to the designer in the GUI). In one embodiment, the number of factors further includes information regarding the area of the integrated circuit over which the 2-dimensional grid is situated. In some embodiments, the determined grid size extends to the full surface area of the IC. In some embodiments, the determined grid size extends to a surface area less than the full surface area of the IC. In determining the grid size, an x-axis length of the grid is determined. The y-axis length of the grid is further determined. Alternatively, a ratio of the length of the x-axis to the length of the y-axis is determined. For example, the ratio of x to y is 2:3. The x-axis length is hereinafter referred to as "M". The y-axis length is hereinafter referred to as "N".

At 904, the larger of N and M is determined. In some embodiments, the larger axis of the grid is determined by a comparison. In some embodiments, the larger axis of the grid is determined by a division. Other similar means for determining the larger of two values or lengths that would be known to one of ordinary skill in the art should further be considered incorporated herein.

After the larger of N and M is determined, the larger length is determined to have one of an odd or an even length. For example, if N is greater than M, then the odd/even determination is made at 906. If M is greater than N, then the odd/even determination is made at 908. Regardless of the even/odd determination, the larger axis length is divided into two regions. The division of the larger axis length is not necessarily a division of the axis length into two equal parts, although in some embodiments that may be the case.

If N (which was the larger of N and M in 904) is an even value, as is determined at 908, then the dividing line is placed at 910. If M (which was the larger of N and M in 904) is an even value, as is determined at 908, then the dividing line is placed in accordance with 914. When the larger axis length is even, the grid is divided along the larger axis length such that half of the flops are located on one side of the dividing line and half of the flops are located on the other side of the dividing line.

In accordance with 910, where N>M and where N is even, the number of flops on each side of the dividing line equals $$\frac{\text{total flops}}{2}.$$

Further in accordance with 910, when the grid is divided along the N axis to generate two regions, the new axis values of both the first area and the second area resulting from the division are set to N/2.

At 914, where M>N and where M is even, the number of flops on each side of the dividing line equals $$\frac{\text{total flops}}{2}.$$

Also at 914, when the grid is divided along the M axis to generate two regions, the new axis values of both the first area and the second area resulting from the division is set to M/2.

If N (which was the larger of N and M in 904) is an odd value, as is determined at 906, then the dividing line is placed as indicated at 912. If M (which was the larger of N and M in step 904) is an even value, as is determined at 908, then the dividing line is placed as indicated at 916. When the larger axis length is odd, the grid is divided along the larger axis length such that a portion of the flops are located on one side of the dividing line and the remaining portion of the flops are located on the other side of the dividing line.

In accordance with 912, where N>M and where N is odd, the number of flops on a first side of the dividing line equals $$\frac{\text{floor}\left(\frac{N}{2}\right)}{N} \times (\text{total flops}).$$

The number of flops of a second side of the dividing line equals $$\frac{\text{floor}\left(\frac{N}{2}\right)+1}{N} \times (\text{total flops}).$$

Further in accordance with 912, the grid is divided along the N axis to generate two regions. The new axis value for the first region on the first side of the dividing line is floor $$\left(\frac{N}{2}\right).$$

The new axis value for the second region on the second side of the dividing line is floor $$\left(\frac{N}{2}\right)+1.$$

In accordance with 916, where M>N and where M is odd, the number of flops on each side of the dividing line equals $$\frac{\text{floor}\left(\frac{M}{2}\right)}{M} \times (\text{total flops}).$$

The number of flops on a second side of the dividing line equals $$\frac{\text{floor}\left(\frac{M}{2}\right)+1}{M} \times (\text{total flops}).$$

Further in accordance with 916, the grid is divided along the M axis to generate two regions. The new axis values for the first region on the first side of the dividing line is floor $$\left(\frac{M}{2}\right).$$

The new axis value for the second region on the second side of the dividing line is floor $$\left(\frac{M}{2}\right)+1.$$

At 918, after each dividing line is placed, and two new regions of the IC are generated, each of the new regions is evaluated to determine whether it is of a 1×1 grid size. If both are of a 1×1 grid size, then flow ends at 922, meaning that the grid has been fully divided into regions of appropriate sizes. If one of the regions is of a size that is greater than 1×1, then the method iterates as shown at 920. When the method reinitiates at 904, it is the new N and M values of the region under review that dictate the results in 904 to 916, not the initial N and M values of the bisected region.

Figure 10:
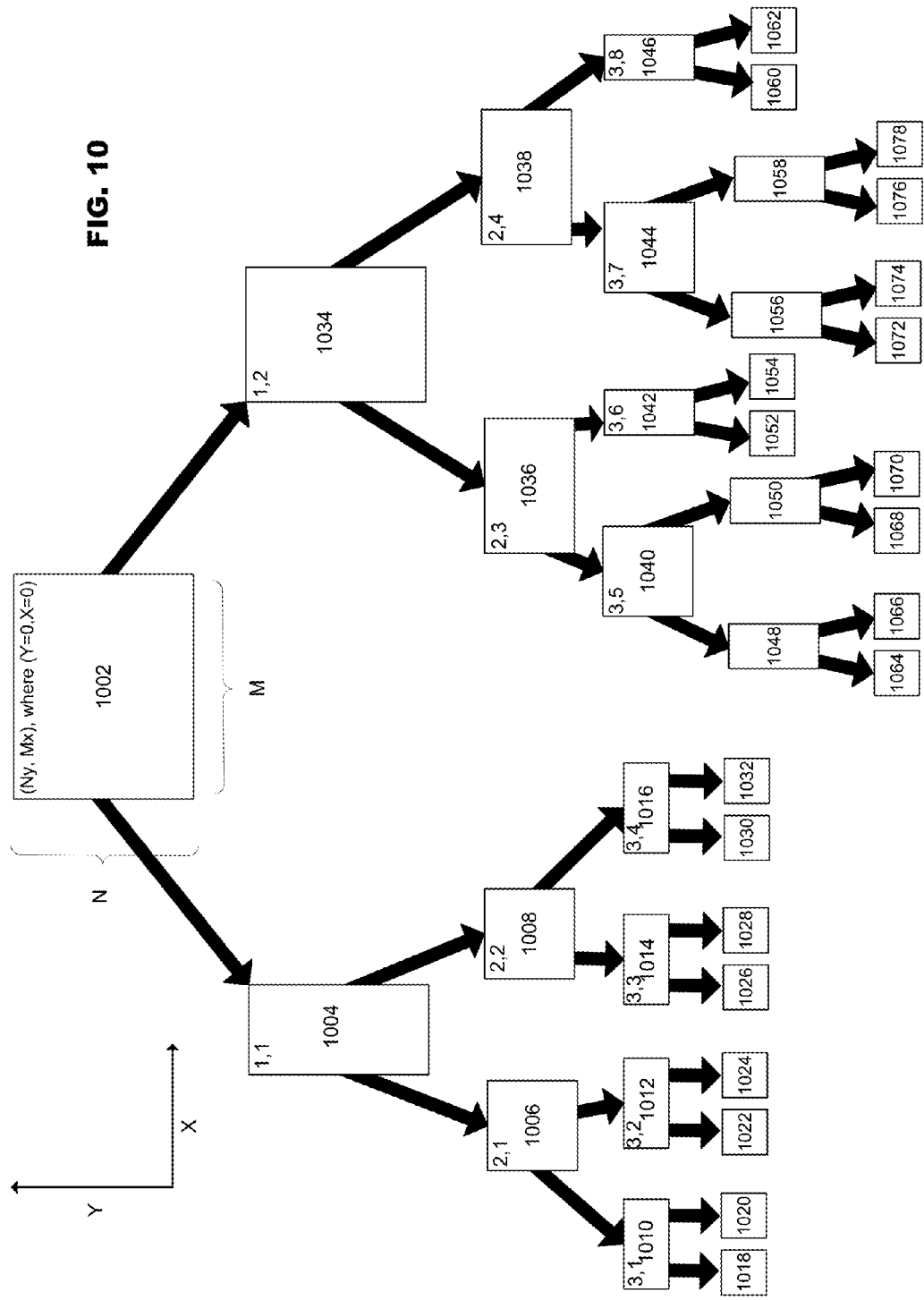
FIG. 10 illustrates an IC divided, step by step, according to the bisecting method.

FIG. 10 illustrates an IC divided, step by step, according to the bisecting method. Original IC 1002 includes 100 flops. According to a determination, the surface area of IC is determined to fit into a grid having a relative y-axis of 4 and a relative x-axis of 5. In accordance with the method, $N_0$ is 4 and $M_0$ is 5. $M_0$, as compared to $N_0$, is larger than $N_0$. Therefore it is checked whether $M_0$ is even or odd. It is determined that $M_0$, which has a relative length of 5, is an odd number. Accordingly, $M_0$ is divided into two regions according to the method for odd length bisections.

The first region 1004 to be created from $M_0$ is created to contain:

$$\frac{\text{floor}\left(\frac{M}{2}\right)}{M} \times (\text{total flops}) \text{ flops}.$$

$M_0$ divided by two is 2.5, and the floor of 2.5 is 2. 2 divided by 5 is 0.4. 0.4 multiplied by 100 flops results in 40 flops. Therefore, a dividing line must be placed along the length of $M_0$ such that there is a region of 40 flops on one side of the dividing line. Therefore, the first region 1004 is resized along the x-axis in order to capture this number of flops.

The new dimensions of the first region are determined first by keeping the unchanged dimension from the previous region: $N_0$ becomes $N_{1,1}$. The other dimension is determined by applying the following formula: floor $$\left(\frac{M}{2}\right).$$

$M_0$ divided by two is 2.5, and the floor of 2.5 is 2. Therefore, $M_{1,1}$ is 2.

Therefore the new dimensions of the first region 1004 are set such that it has new dimensions of a relative x-axis of 2 and a relative y-axis of 4. $M_{1,1}$ is 2 and $N_{1,1}$ is 4.

The second region 1034 to be created from $M_0$ is created to contain:

$$\frac{\text{floor}\left(\frac{M}{2}\right)+1}{M} \times (\text{total flops}) \text{ flops}.$$

$M_0$ divided by two is 2.5, and the floor of 2.5 is 2. Adding 1 makes 3, which then is divided by 5 and multiplied by 100 flops, yielding 60 flops. Therefore, the dividing line must be placed along the length of $M_0$ such that there is a region of 60 flops on one side of the dividing line. Therefore, the second region 1034 is resized along the x-axis in order to capture is number of flops.

The new dimensions of the second region 1034 are determined first by keeping the unchanged dimension from the previous region: $N_0$ becomes $N_{1,2}$. The other dimension is determined by applying the following formula: floor $$\left(\frac{M}{2}\right)+1.$$

$M_0$ divided by two is 2.5, and the floor of 2.5 is 2. Adding 1 makes 3, and so $M_{1,2}$ is 3.

As can be noted from the above, in practice only one of the calculations along each length is necessary. This is because total length of $M_0$–length of $M_{1,1}$=length of $M_{1,2}$. In other words, 5–2=3. Similarly this is because total number of flops–flops in first region=flops in second region. In other words 100 flops–40 flops=60 flops.

Looking again at FIG. 10, the original IC 1002, having dimensions 4×5, is divided to yield first region 1004, having dimensions 4×2, and second region 1034, having dimensions 4×3. The method is repeated for each of first region 1004 ($N_{1,1} \times M_{1,1}$) and second region 1034 ($N_{1,2} \times M_{1,2}$) until each of the resulting regions from the placements of the dividing lines are of a 1×1 grid size.

Therefore, the bisecting method is continued for region 1004. In accordance with the method, $N_{1,1}$ is 4 and $M_{1,1}$ is 2. $N_{1,1}$, as compared to $M_{1,1}$, is larger than $M_{1,1}$. Therefore it is checked whether $N_{1,1}$ is even or odd. It is determined that $N_{1,1}$, which has a relative length of 4, is an even number. Accordingly, $N_{1,1}$ is divided into two regions according to the method for even length bisections.

$$\frac{\text{total flops}}{2}$$

The first region 1006 to be created from $N_{1,1}$ is created to contain: flops.

The number of flops in region 1004 was 40, which divided by two is 20.

Therefore, a dividing line must be placed along the length of $N_{1,1}$ such that there is a region of 20 flops on one side of the dividing line. Consequently, the first region 1006 is resized along the y-axis in order to capture this number of flops.

The new dimensions of the first region 1006 are determined first by keeping the unchanged dimension from the previous region: $M_{1,1}$ becomes $M_{2,1}$. The other dimension is determined by applying the following formula:

N/2. $N_{1,1}$ divided by two is 2. Therefore, $N_{2,1}$ is 2.

The new dimensions of the first region 1006 are set such that it has a relative x-axis of 2 and a relative y-axis of 2. $N_{2,1}$ is 2 and $M_{2,1}$ is 2.

The second region 1008 to be created from $M_{1,1}$ is created to contain:

$$\frac{\text{total flops}}{2}$$

flops.

The number of flops in region 1004 was 40, which divided by two is 20. Therefore, a dividing line must be placed along the length of $N_{1,1}$ such that there is a region of 20 flops on one side of the dividing line. Consequently, the first region 1006 is resized along the y-axis in order to capture this number of flops.

The new dimensions of the second region 1008 are determined first by keeping the unchanged dimension from the previous region: $M_{1,1}$ becomes $M_{2,2}$. The other dimension is determined by applying the following formula:

M/2. $N_{1,1}$ divided by two is 2. Therefore, $N_{2,2}$ is 2.

The new dimensions of the second region 1008 are set such that it has a relative x-axis of 2 and a relative y-axis of 2. $N_{2,2}$ is 2 and $M_{2,2}$ is 2.

As can be noted from the above, in practice only one of the calculations along each length is necessary. This is because total length of $N_{1,1}$–length of $N_{2,1}$=length of $N_{2,2}$. In other words, 4−2=2. Similarly this is because total number of flops–flops in first region=flops in second region. In other words 40 flops−20 flops=20 flops. As also can also be noted from the above, when a dimension, M or N, is even, each region on either side of the dividing line will contain exactly half of the flops of the original region.

As the bisecting method is continued for region 1006, it should be understood that the bisecting method is also carried out for 1008. In some embodiments, the computations for bisecting 1008 are carried out in parallel to the computations for bisecting 1006. In some embodiments, the computations for bisecting 1006 and 1008 are carried out sequentially. Furthermore, it is understood that because region 1008 has identical dimensions to 1006, the bisecting procedure for region 1008 is performed in the exact same manner as that described below with specific reference to region 1006. However, it should be understood that the example shown in FIG. 10 demonstrates the physical appearance of the bisecting method when all of the flops are evenly distributed over the surface of the IC. This is not necessarily the case in all computations, and execution of the bisecting method with non-even distributions of flops is possible in accordance with the method.

The bisecting method is continued for region 1006. In accordance with the method, $N_{2,1}$ is 2 and $M_{2,1}$ is 2. $M_{2,1}$, as compared to $N_{2,1}$, is the same size. However, because the grid dimensions are not yet 1×1, the method does not stop. In the following embodiment, the division continues along the length of $N_{2,1}$; however, the division could in some embodiments continue along the length of $M_{2,1}$. Therefore it is checked whether $N_{2,1}$ is even or odd. It is determined that $N_{2,1}$, which has a relative length of 2, is an even number. Accordingly, $N_{2,1}$ is divided into two regions according to the method for even length bisections.

The first region 1010 to be created from $N_{2,1}$ is created to contain:

$$\frac{\text{total flops}}{2}$$

flops.

The number of flops in region 1006 was 20, which divided by two is 10. Therefore, a dividing line must be placed along the length of $N_{2,1}$ such that there is a region of 10 flops on one side of the dividing line. Consequently, the first region 1010 is resized along the y-axis in order to capture this number of flops.

The new dimensions of the first region 1010 are determined first by keeping the unchanged dimension from the previous region: $M_{2,1}$ becomes $M_{3,1}$. The other dimension is determined by applying the following formula:

N/2. $N_{2,1}$ divided by two is 1. Therefore, $N_{3,1}$ is 1.

The new dimensions of the first region 1010 are set such that it has new dimensions of a relative x-axis of 2 and a relative y-axis of 1. $N_{3,1}$ is 1 and $M_{3,1}$ is 2.

The second region 1012 to be created from $N_{2,1}$ is created to contain:

$$\frac{\text{total flops}}{2}$$

flops.

The number of flops in region 1006 was 20, which divided by two is 10. Therefore, a dividing line must be placed along the length of $N_{2,1}$ such that there is a region of 10 flops on one side of the dividing line. Therefore, the second region 1012 is resized along the y-axis in order to capture this number of flops.

The new dimensions of the second region 1012 are determined first by keeping the unchanged dimension from the previous region: $M_{2,1}$ becomes $M_{3,2}$. The other dimension is determined by applying the following formula:

N/2.

$N_{2,1}$ divided by two is 1. Therefore, $N_{3,2}$ is 1.

The new dimensions of the second region 1012 are set such that it has a relative x-axis of 2 and a relative y-axis of 1. $N_{3,2}$ is 1 and $M_{3,2}$ is 2.

As can be noted from the above, in practice only one of the calculations along each length must be made. This is because total length of $N_{2,1}$–length of $N_{3,1}$=length of $N_{3,2}$. In other words, 2–1=1. Similarly, this is because total number of flops–flops in first region=flops in second region. In other words 20 flops–10 flops=10 flops. As can also be noted from the above, when a dimension, M or N, is even, each region on either side of the dividing line will contain exactly half of the flops of the original region.

As the bisecting method is continued for region 1010, it should be understood that the bisecting method is also carried out for 1012, 1014, and 1016. In some embodiments, the computations for bisecting 1012, 1014, and 1016 are carried out in parallel to the computations for bisecting 1010. In some embodiments, the computations for bisecting 1010 and 1012, 1014, and 1016 are carried out sequentially. Furthermore, it is understood that because regions 1012, 1014, and 1016 have identical dimensions to 1010, the bisecting procedure for regions 1012, 1014, and 1016 is performed in the same manner as described below with reference to region 1010. However, it should be understood that the example shown in FIG. 10 demonstrates the physical appearance of the bisecting method when all of the flops are evenly distributed over the surface of the IC. This is not necessarily the case in all computations, and execution of the bisecting method with non-even distributions of flops is possible in accordance with the method.

Therefore, the bisecting method is continued for region 1010. In accordance with the method, $N_{3,1}$ is 1 and $M_{3,1}$ is 2. $M_{3,1}$, as compared to $N_{3,1}$, is larger than $N_{3,1}$. Therefore it is checked whether $M_{3,1}$ is even or odd. It is determined that $M_{3,1}$, which has a relative length of 2, is an even number. Accordingly, $M_{3,1}$ is divided into two regions according to the method for even length bisections.

The first region 1018 to be created from $M_{3,1}$ is created to contain:

$$\frac{\text{total flops}}{2}$$

flops.

The number of flops in region 1010 was 10, which divided by two is 5. Therefore, a dividing line must be placed along the length of $M_{3,1}$ such that there is a region of 5 flops on one side of the dividing line. Consequently, the first region 1018 is resized along the x-axis in order to capture this number of flops.

The new dimensions of the first region 1018 are determined first by keeping the unchanged dimension from the previous region: $N_{3,1}$ becomes $N_{4,1}$. The other dimension is determined by applying the following formula:

M/2. $M_{3,1}$ divided by two is 1. Therefore, $M_{4,1}$ is 1.

Therefore the new dimensions of the first region 1018 are set such that it has a relative x-axis of 1 and a relative y-axis of 1. $N_{4,1}$ is 1 and $M_{4,1}$ is 1.

The second region 1020 to be created from $M_{3,1}$ is created to contain:

$$\frac{\text{total flops}}{2}$$

flops.

The number of flops in region 1010 was 10, which divided by two is 5. Therefore, a dividing line must be placed along the length of $M_{3,1}$ such that there is a region of 5 flops on one side of the dividing line. Consequently, the second region 1020 is resized along the x-axis in order to capture this number of flops.

The new dimensions of the second region 1020 are determined first by keeping the unchanged dimension from the previous region: $N_{3,1}$ becomes $N_{4,2}$. The other dimension is determined by applying the following formula:

M/2. $M_{3,1}$ divided by two is 1. Therefore, $M_{4,2}$ is 1.

The new dimensions of the second region 1020 are set such that it has a relative x-axis of 1 and a relative y-axis of 1. $N_{4,2}$ is 1 and $M_{4,2}$ is 1.

As can be noted from the above, in practice only one of the calculations along each length must be made. This is because total length of $M_{3,1}$–length of $M_{4,1}$=length of $M_{4,2}$. In other words, 2–1=1. Similarly this is because total number of flops–flops in first region=flops in second region. In other words 10 flops–5 flops=5 flops. As can also be noted from the above, when a dimension, M or N, is even, each region on either side of the dividing line will contain exactly half of the flops of the original region.

At this point, because some of the resultant dimensions for grid cells (e.g., 1018, 1020, 1022, 1024, 1026, 1028, 1030, and 1032) from the bisection method are of a grid size of 1 ×1, the method stops for these regions. However, the bisecting method is continued for initially created second region 1034, having dimensions 4×3. As described above, the second region 1034 has dimensions $N_{1,2} \times M_{1,2}$. In accordance with the method, $N_{1,2}$ is 4 and $M_{1,2}$ is 3. The bisecting method is continued to be applied to region 1034 and its progeny regions, similarly to the process described for region 1004 and its progeny regions, until each resulting region is of a grid size of 1×1. Because the process proceeds similarly to the foregoing description, for the sake of brevity further description will not be provided. However, the illustrations for region 1034 and its progeny regions should help visualize the branch of bisections from region 1034.

Figure 11:
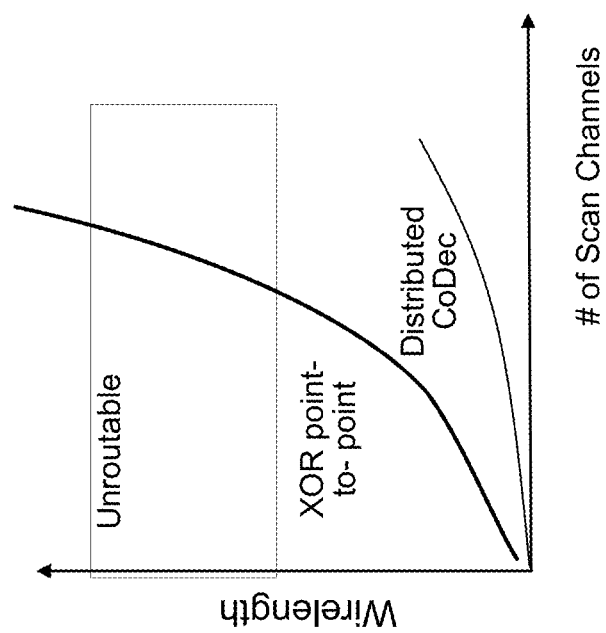
FIG. 11 illustrates the difference in wire length (along the Y-axis) to the number of scan channels (along the X-axis) when a CoDec is wired using XOR point-to-point versus a distributed CoDec as described herein.

FIG. 11 illustrates the difference in wire length (along the Y-axis) to the number of scan channels (along the X-axis) when a CoDec is wired using XOR point-to-point versus a distributed CoDec as described herein. As shown, as the number of scan channels increases, the global implementation (or point to point implementation) of wiring increases exponentially into the unroutable area, while the distributed decompression XORs made possible with usage of the bisected grid results in the amount of wiring increasing relatively slowly.

Some of the foregoing embodiments refer to algorithms, sequences, macros, and operations that require execution of instructions and the usage of a memory. Execution of the instructions stored in memory may be performed by a processing device of an apparatus, the processing device specific to the apparatus. The apparatus hosting the processing device may be in some circumstances the ATE, or in other circumstances, the IC. The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, read-only memories (ROMs), random access memories (RAMs), electrically erasable programmable read-only memory (EEPROM), flash memory, magnetic or optical cards, or an type of media that stores electronic instructions. Each of the memory devices implemented in the apparatus is further connected to or coupled to a system bus or a network connection, wired or unwired, capable of facilitating or driving communications.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method, implemented by a computer, for performing physical scans of an integrated circuit by dividing an area of an integrated circuit into a 2-dimensional grid, the method comprising:
 a) determining a grid size of the 2-dimensional grid which includes the area of the integrated circuit and a number of flops within the 2-dimensional grid, the grid size having a first side length and a second side length;
 b) for each region of the grid, having a number of flops for the grid region, having one of a respective first side length and a respective second side length that is greater than one:
  i) selecting a larger side, having a length X, from the respective first side length and the respective second side length,
  ii) determining if the length X is even or odd,
  iii) responsive to the length of the larger side being odd, dividing the grid region into:
   a first region having:

$$\frac{\text{floor}\left(\frac{X}{2}\right)}{X} \times \text{the number of flops for the grid region, flops,}$$

and
   a second region having:

$$\frac{\text{floor}\left(\frac{X}{2}\right)}{X} \times \text{the number of flops for the grid region, flops,}$$

and
  iv) responsive to the length of the larger side being even, dividing the grid region into:
   a third region and a fourth region each having:

$$\left(\frac{X}{2}\right) \times \text{the number of flops for the grid region;}$$

c) repeating b)i)-b)iv) until said respective first side length is one and said respective second side length is one; and
 d) for each region of the grid wherein the respective first side length is one and the respective second length is one, providing logic circuitry for performing the physical scan.

2. The method of claim 1, further comprising, responsive to the length of the larger side being odd:
 assigning the first region a new length equal to floor $$\left(\frac{X}{2}\right),$$

and
 assigning the second region a new length equal to floor $$\left(\frac{X}{2}\right) + 1.$$

3. The method of claim 1, further comprising, responsive to the length of the larger side being even:
 assigning both of the third region and the fourth region a new length equal to X divided by 2.

4. The method of claim 1, wherein a resulting grid region having a first side length of one and a second side length of one includes only one scan chain that is provided with scan input from decompression logic.

5. The method of claim 1, wherein a resulting grid region having a first side length of one and a second side length of one includes a plurality of scan chains.

6. The method of claim 5, further comprising:
 implementing a local broadcast of decompressed data to the plurality of scan chains in the resulting grid region.

7. A non-transitory computer-readable medium encoded with software code instructions, when executed by a computer, implementing a method for performing test scans of an integrated circuit by dividing an area of an integrated circuit into a 2-dimensional grid, the method comprising:
 a) determining a grid size of the 2-dimensional grid which includes the area of the integrated circuit and a number of flops within the 2-dimensional grid, the grid size having a first side length and a second side length;
 b) for each region of the grid having one of a respective first side length and a respective second side length that is greater than one:
  i) selecting a larger side, having a length X, from the respective first side length and the respective second side length,
  ii) determining if the length X is even or odd,
  iii) responsive to the length of the larger side being odd, dividing the grid region into:

a first region having:

$$\frac{\text{floor}\left(\frac{X}{2}\right)}{X} \times \text{the number of flops for the grid region, flops,}$$

and a
second region having:

$$\frac{\text{floor}\left(\frac{X}{2}\right)}{X} \times \text{the number of flops for the grid region, flops,}$$

and
iv) responsive to the length of the larger side being even, dividing the grid region into:
a first region and a second region each having:

$$\left(\frac{X}{2}\right) \times \text{the number of flops for the grid region;}$$

c) repeating b)i)-b)iv) until said respective first side length is one and said respective second side length is one; and
d) for each region of the grid wherein the respective first side length is one and the respective second length is one, providing logic circuitry for performing the physical scan.

8. The non-transitory computer-readable medium of claim 7, the method further comprising, responsive to the length of the larger side being odd:
assigning the first region a new length equal to floor $$\left(\frac{X}{2}\right),$$

and
assigning the second region a new length equal to floor $$\left(\frac{X}{2}\right) + 1.$$

9. The non-transitory computer-readable medium of claim 7, the method further comprising, responsive to the length of the larger side being even:
assigning both of the third region and the fourth region a new length equal to X divided by 2.

10. The non-transitory computer-readable medium of claim 7, wherein a resulting grid region having a first side length of one and a second side length of one includes only one scan chain that is provided with scan input from decompression logic.

11. The non-transitory computer-readable medium of claim 7, wherein a resulting grid region having a first side length of one and a second side length of one includes a plurality of scan chains.

12. The non-transitory computer-readable medium of claim 11, wherein the method further includes implementing a local broadcast of decompressed data to the plurality of scan chains in the resulting grid region.

13. A method, implemented by a computer, for performing test scans of an integrated circuit by dividing an area of an integrated circuit into a 2-dimensional grid, the method comprising:
a) determining a grid size of the 2-dimensional grid which includes the area of the integrated circuit and a number of flops within the 2-dimensional grid, the grid size having a first side length and a second side length;
b) for each region of the grid having one of a respective first side length, N, and a respective second side length, M, that is greater than one:
i) determining if the respective first side length is larger than the respective second side length,
ii) responsive to the first side length being larger than the second side length:
1) determining if the first side length is even,
2) responsive to the first side length being even:
dividing the grid region along the first side length to create a first region and a second region each having half of the flops of the grid region, and
3) responsive to the first side length not being even:
dividing the grid region along the first side length to create a first region having a portion of the flops of the grid region and a second region having a remainder of the flops of the grid region, and
iii) responsive to the first side length being smaller than the second side length:
1) determining if the second side length is even,
2) responsive to the second side length being even:
dividing the grid region along the second side length to create a first region and a second region each having half of the flops of the grid region; and
3) responsive to the second side length not being even:
dividing the grid region along the second side length to create a first region having a portion of the flops of the grid region and a second region having a remainder of the flops of the grid region;
c) repeating b)i)-b)iii) until said respective first side length is one and said respective second side length is one; and
d) for each region of the grid wherein the respective first side length is one and the respective second length is one, providing logic circuitry for performing the physical scan.

14. The computer implemented method of claim 13, further comprising determining one of a new first side length and a new second side length of the first region and the second region when both of the first side length and the second side length are even by:
for grid regions having the first side length being larger than the second side length:
dividing the first side length by two to obtain a first quotient, and
assigning the first quotient to both the new first side length and the new second side length; and
for grid regions having the first side length being smaller than the second side length:
dividing the second side length by two to obtain a second quotient, and
assigning the second quotient to both the new first side length and the new second side length.

15. The computer implemented method of claim 13, wherein the portion of the flops in the first region is determined by:
- for grid regions having the first side length being larger than the second side length:
  - dividing the first side length by two,
  - computing a mathematical floor of the quotient, and
  - dividing the computed mathematical floor by the first side length; and
- for grid regions having the first side length being smaller than the second side length:
  - dividing the second side length by two;
  - computing a mathematical floor of the quotient; and
  - dividing the computed mathematical floor by the first side length.

16. The computer implemented method of claim 13, wherein the remainder of the flops in the second region is determined by:
- for grid regions having the first side length being larger than the second side length:
  - dividing the first side length by two,
  - computing a mathematical floor of the quotient,
  - adding a numerical value one to the computed mathematical floor, and
  - dividing the sum by the first side length; and
- for grid regions having the first side length being smaller than the second side length:
  - dividing the second side length by two,
  - computing a mathematical floor of the quotient,
  - adding the numerical value one to the computed mathematical floor, and
  - dividing the computed mathematical floor by the first side length.

17. The computer implemented method of claim 15, further comprising determining one of a new first side length and a new second side length of the first region by:
- for grid regions having the first side length being larger than the second side length:
  - dividing the first side length by two,
  - computing a mathematical floor of the quotient, and
  - assigning the computed mathematical floor to the new first side length;
- for grid regions having the first side length being smaller than the second side length:
  - dividing the second side length by two,
  - computing a mathematical floor of the quotient, and
  - assigning the computed mathematical floor to the new second side length.

18. The computer implemented method of claim 16, further comprising determining one of a new first side length and a new second side length of the second region by:
- for grid regions having the first side length being larger than the second side length:
  - dividing the first side length by two,
  - computing a mathematical floor of the quotient,
  - adding a numerical value one to the computed mathematical floor, and
  - assigning the sum to the new first side length;
- for grid regions having the first side length being smaller than the second side length:
  - dividing the second side length by two,
  - computing a mathematical floor of the quotient,
  - adding a numerical value one to the computed mathematical floor, and
  - assigning the sum to the new second side length.

19. The computer implemented method of claim 13, wherein a resulting grid region having a first side length of one and a second side length of one includes a plurality of scan chains.

20. The computer implemented method of claim 19, wherein the method further includes implementing a local broadcast of decompressed data to the plurality of scan chains in the resulting grid region.

* * * * *